United States Patent [19]
Reich et al.

[11] Patent Number: 5,958,635
[45] Date of Patent: Sep. 28, 1999

[54] LITHOGRAPHIC PROXIMITY CORRECTION THROUGH SUBSET FEATURE MODIFICATION

[75] Inventors: Alfred John Reich; Hak-Lay Chuang; Michael E. Kling; Paul G. Y. Tsui; Kevin Lucas; James N. Conner, all of Austin, Tex.

[73] Assignee: Motorola, Inc., Schaumburg, Ill.

[21] Appl. No.: 08/954,160

[22] Filed: Oct. 20, 1997

[51] Int. Cl.$^6$ ..................................................... G03F 9/00
[52] U.S. Cl. ............................. 430/30; 430/296; 430/942
[58] Field of Search ............................... 430/30, 296, 942

[56] References Cited

U.S. PATENT DOCUMENTS 4,895,780  1/1990  Nissan-Cohen et al. ................... 430/5
5,242,770  9/1993  Chen et al. ................................. 430/5

*Primary Examiner*—Christopher G. Young
*Attorney, Agent, or Firm*—Bruce E. Hayden; M. Kathryn Tsirigotis

[57] ABSTRACT

Lithographic Proximity Correction (LPC) shapes are added (503) to a layer of a layout database file (501). Geometric criteria such as feature width are then used to filter the added LPC shapes (502). The LPC shapes are then modified (505) by determining which LPC shapes are within a predetermined distance from a shape in a layer of the second data base (504). The database file, including the modified LPC shapes, is then used to manufacture a set of lithographic masks (506). The lithographic masks are then used to pattern a set of wafers in the manufacture of integrated circuits (507).

21 Claims, 8 Drawing Sheets

LITHOGRAPHIC PROXIMITY CORRECTION THROUGH SUBSET FEATURE MODIFICATION

CROSS REFERENCE TO RELATED APPLICATION

This application is related to copending U.S. patent applications assigned to assignee hereof:

"PROCESS FOR PRODUCING A LITHOGRAPHIC RETICLE AND FABRICATING SEMICONDUCTOR DEVICES USING SAME" to Kevin Lucas et al., filed Jan. 29, 1997, and issued Dec. 15, 1998 as U.S. Pat. No. 5,849,440, and attorney docket number SC90168AP01.

"ONE DIMENSIONAL LITHOGRAPHIC CORRECTION USING DRC SHAPE FUNCTIONS" to Alfred J. Reich et al., filed Mar. 3, 1997, with application Ser. No. 08/805,863, and attorney docket number SC90429A; and "TWO DIMENSIONAL LITHOGRAPHIC CORRECTION USING DRC SHAPE FUNCTIONS" to Alfred J. Reich et al., filed Mar. 3, 1997, with application Ser. No. 08/810,561, and attorney docket number SC90316A.

FIELD OF THE INVENTION

The present invention relates to very large scale integrated (VLSI) circuit lithographic mask design, and more specifically to optimizing proximity correction of VLSI circuit design data bases.

BACKGROUND OF THE INVENTION

Lithographic proximity correction (LPC) is used in VLSI circuits to correct for printing errors such as two-dimensional lithographic errors. In integrated circuits having printed shapes with sizes that approach the wavelength of exposure, two-dimensional lithographic printing errors may occur because of electromagnetic diffraction from orthogonal edges of a mask feature during the lithographic printing process. Additionally, photoresist diffusion and etch effects can cause two dimensional lithographic printing errors. LPC is used to correct for these optical and non-optical undesirable printing errors by adding or subtracting other features or shapes to or from the original design shapes. These other features are used to modify the original design in order to compensate for certain undesirable effects that may take place during printing.

FIGS. 1 and 2 together are used to illustrate the use of LPC shapes in the prior art. Specifically, FIG. 1 illustrates a portion of a semiconductor design database 100 having multiple shapes. Shapes 110 and 115 would generally represent an interconnect structure, such as a metal-1 interconnect for a semiconductor device. The shapes 120–123 in FIG. 1 represent contacts. Contacts are used to connect different layers within a semiconductor design. In other words, the metal-1 interconnect 110 would be connected to another interconnect layer, which is not shown, through the contacts 120 and 122. The shape 124 would represent a via, whereby a via connects a specific interconnect layer to another interconnect layer (e.g. metal-2). As the shapes 110 and 115 become narrower in size as technologies improve, the lithographic printing errors can become increasingly significant. For example, narrow line ends tend to foreshorten. Therefore, as illustrated in FIG. 2, the use of LPC shapes 219, 220, 221, 223, 224, 225, 231, 230, 226, 227, 228, and 229, have been added in the prior art in order to allow proper lithographic resolution of the shapes 110 and 115.

While the additions of the assist features illustrated in FIG. 2 allow for more precise replication of the shapes 110 and 115 as described in the data base, other problems are introduced. A first problem associated with the adding of the LPC features illustrated in FIG. 2, is that the size of the database file greatly increases. For the shape 110, where previously a shape having eight vertices needed to be stored, following the LPC additions, a total of 32 vertices must be stored in order to represent the shape with the LPC shapes added. Therefore, the amount of database room needed to store a prior art LPC design is significantly greater than the initial design itself. In addition, the amount of time needed to identify and add the LPC shapes can be significant. However, a yet more important issue with the prior art use of LPC features is that an interaction between adjacent LPC features can occur causing errors in the over all database.

One problem with interact ion between the system features can be best understood with reference to features 226 and 228 of FIG. 2. Specifically, if following the addition of assist feature 228 to interconnect 115, and the addition of LPC feature 226 to shape 110, it is possible that features 226 and 228 may now reside in close enough proximity to each another such th at an electrical short may be created during the manufacturing process. Such a short would most likely cause a failure in the overall semiconductor device 100.

Therefore, the basic assumption made when LPC features are added, is that the LPC feature allows the proper resolution of the desired shape, such as shape 115, and that the LPC features themselves do not appear on this final manufactured device. However, when LPC features are placed in such close proximity, such as features 226 and 228, it is possible for the shapes 115 and 110 to be modified such that the LPC features themselves are now resolved onto the final semiconductor device there by causing problems.

Therefore, it would be desirable for an LPC process to be capable of eliminating the problems associated with LPC features in close proximity.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which.

DETAILED DESCRIPTION

Figure 8:
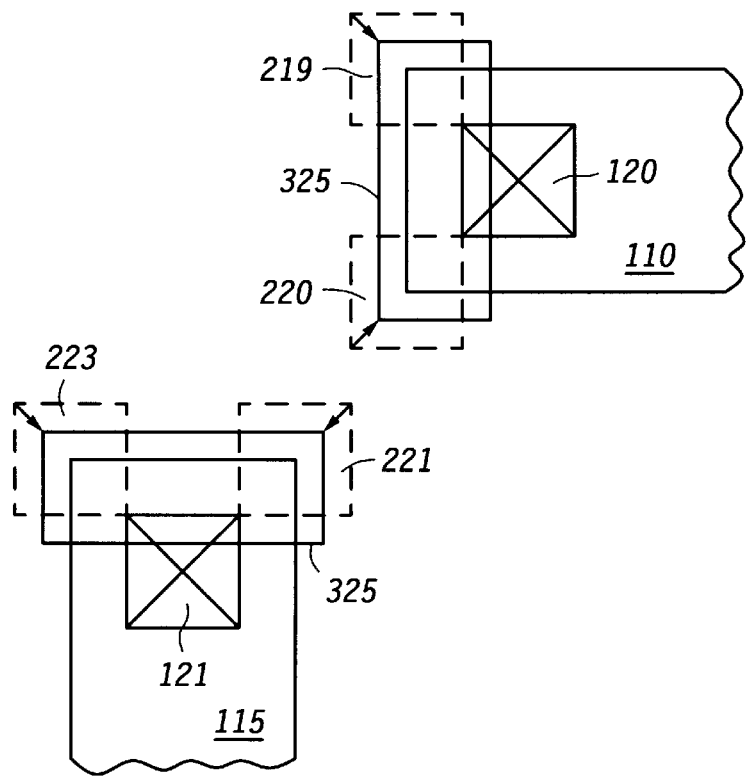
Figure 9:
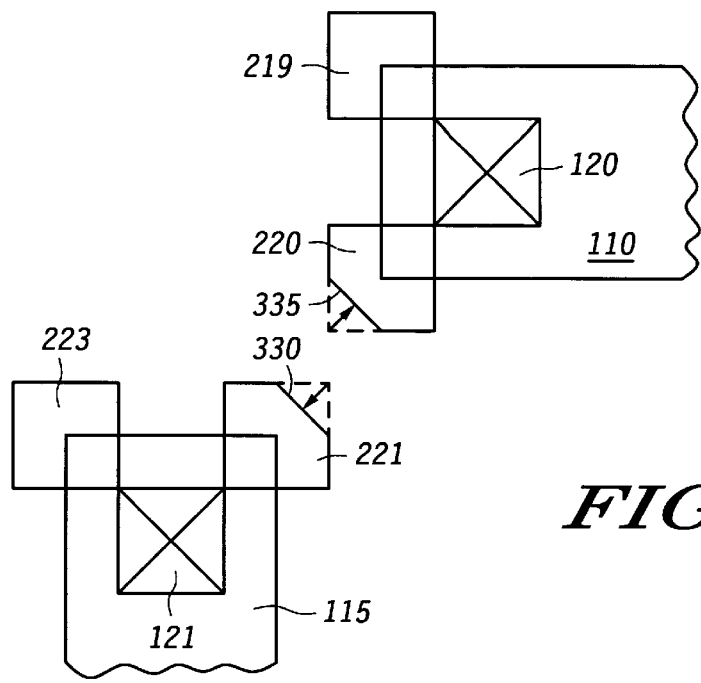
Figure 10:
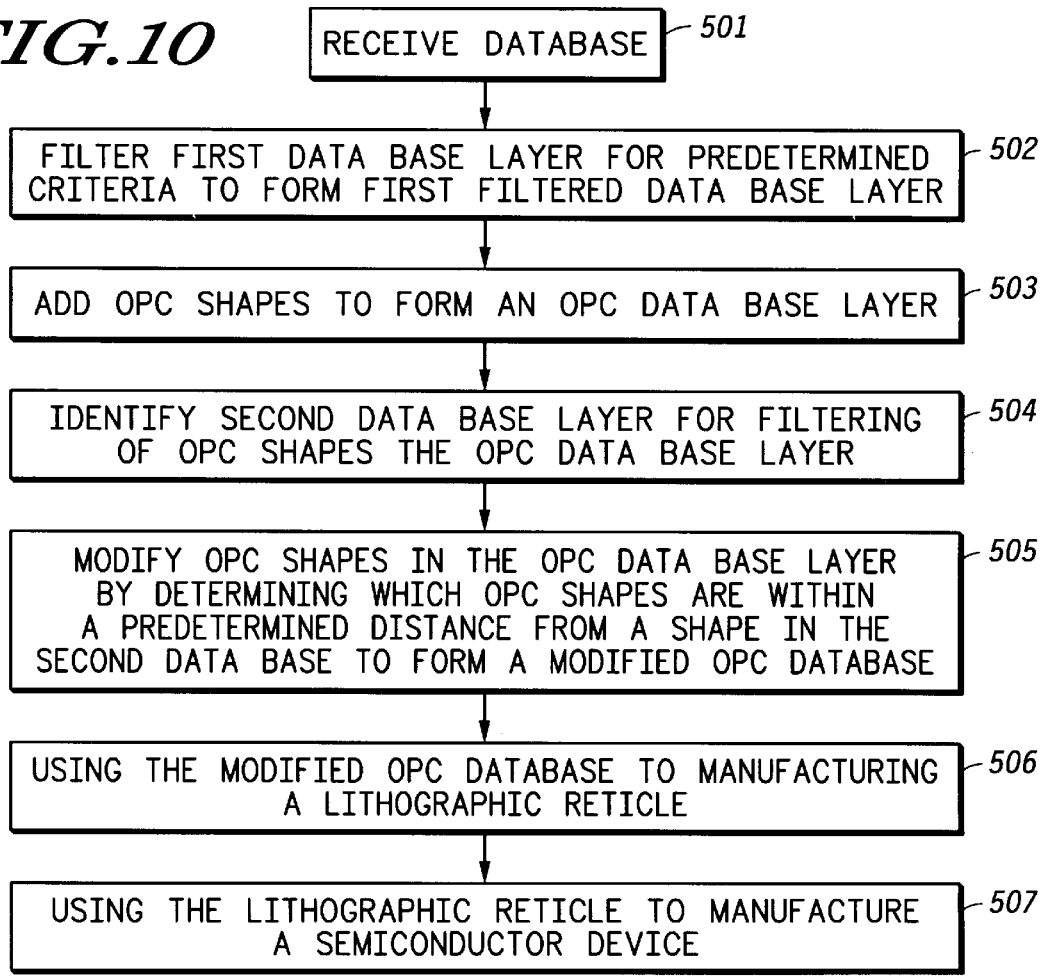
FIG. 10 illustrates, in flow diagram form, a method in accordance with the present invention.

The present invention is best understood with the specific method of FIG. 10 and supported by the FIGS. 1–9. Referring to FIG. 10, at a step 501, a database is received. It would be understood by one skilled in the art, that the semiconductor device structure 100 illustrated in FIG. 1 would be represented within an electronic database. Within the database, there would be multiple layers associated with the design. For example, the interconnect structures 110 and 115 would generally be a metal-1 interconnect layer, or higher interconnect layer. It would be understood that these shapes 110 and 115 would generally be stored within a specific region of the database for all structures within that layer. In like manner, the contacts 120 through 123 would be stored in a separate layer which in turn would be stored in a like manner. The shape 124 could represent yet a different structure, that being a via which would make a connection between interconnect layers. The shape 124 in turn could also be stored within a separate layer within the database. While for purposes of discussion, the database 100 will be discussed with reference to shapes 110 and 115 being specifically metal-1 layers, it should be understood by one skilled in the art that the present invention would be equally as applicable to many different layers or structures. For example, a local interconnect layer could benefit from the use of the present invention.

Figure 3:
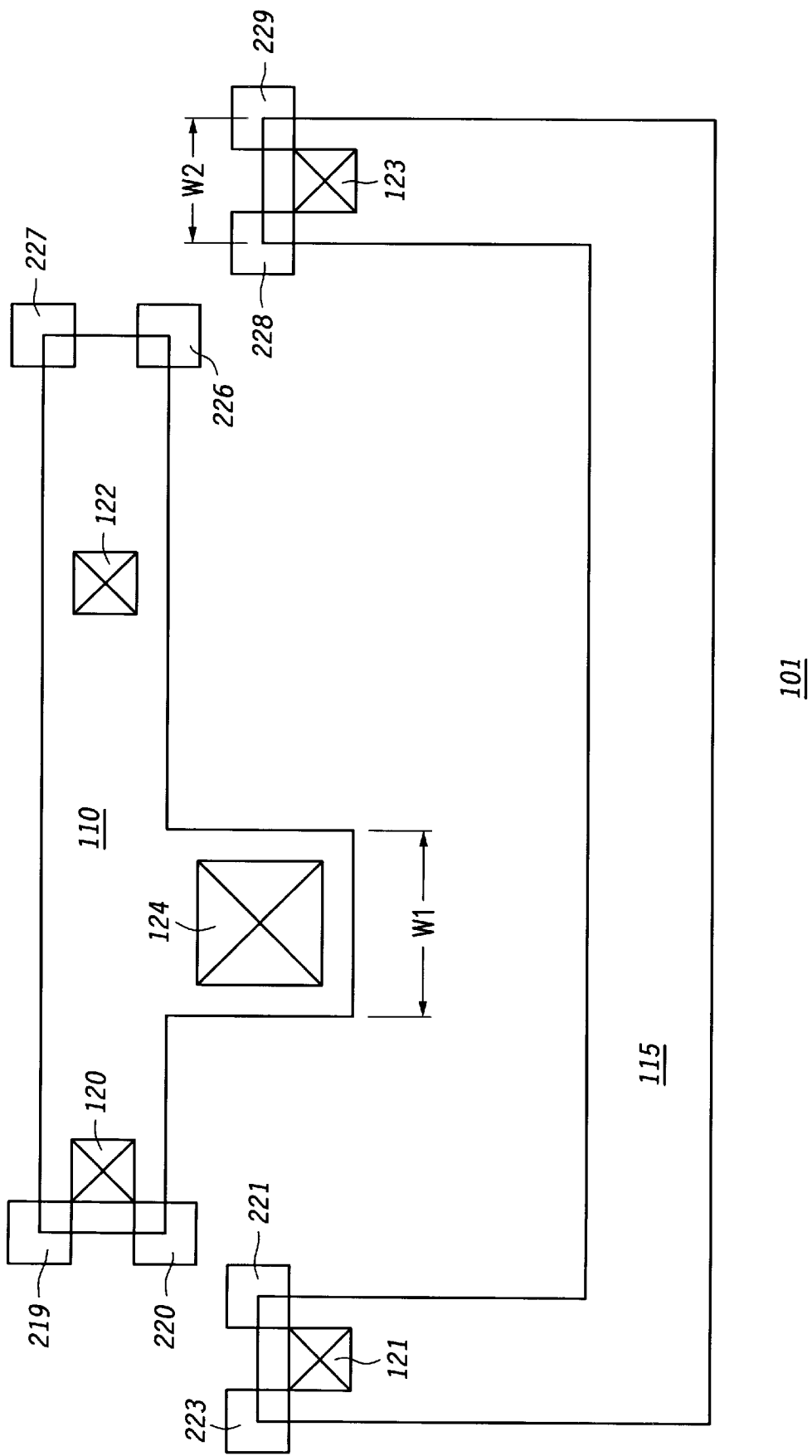
FIGS. 3 and 4 illustrate, in plan view, the shapes of FIG. 1 following LPC enhancements in accordance with the present invention.

Next, at step 502, the database layer received in step 501 is filtered for a first predetermined set of criteria in order to form a first filtered database layer. Specifically, at step 502, it is desirable to determine where the use of LPC features would actually be beneficial. With one embodiment of the present invention, it may be known that for a specific layer there are certain locations where it may or may not be desirable to place LPC features. For example, with the metal-1 layer, which would include shapes 110 and 115, it is known in a specific embodiment, that LPC features are needed only where the interconnect shape width is below a certain dimension. Referring to FIG. 3, the width W1 would represent a width which is greater than the minimum width. Therefore, it would not be necessary to add LPC features on the portion of shape 110 associated with the corners identified by width W1. However, width W2 represents a width which is below the predetermined amount such that its vertices would benefit from the addition of the LPC features 228 and 229. Therefore, at step 502, a first filtering step can occur whereby those shapes not meeting the predefined criteria are eliminated from further consideration.

Figure 1:
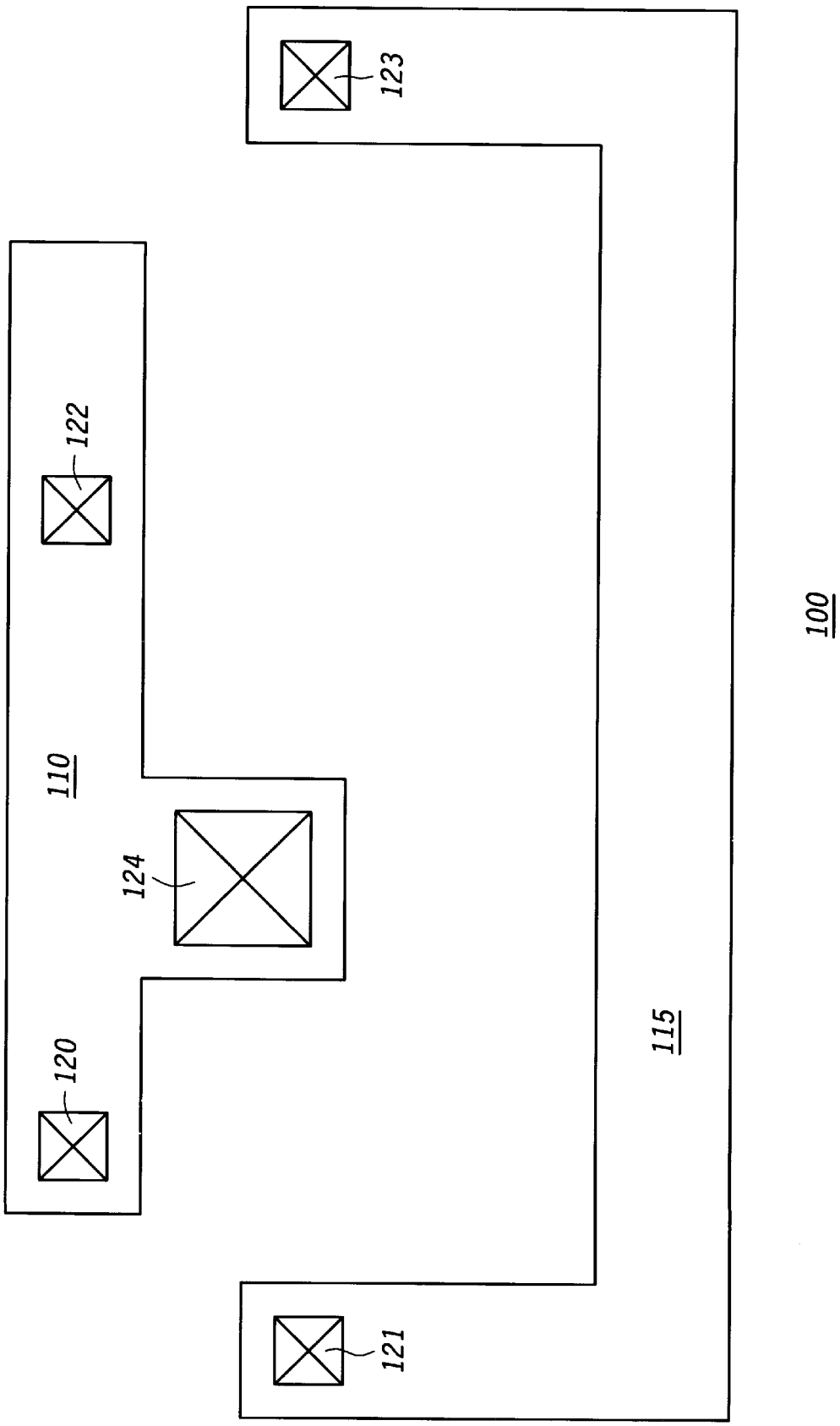
FIG. 1 illustrates, in plan view, shapes associated with a design database.
Figure 2:
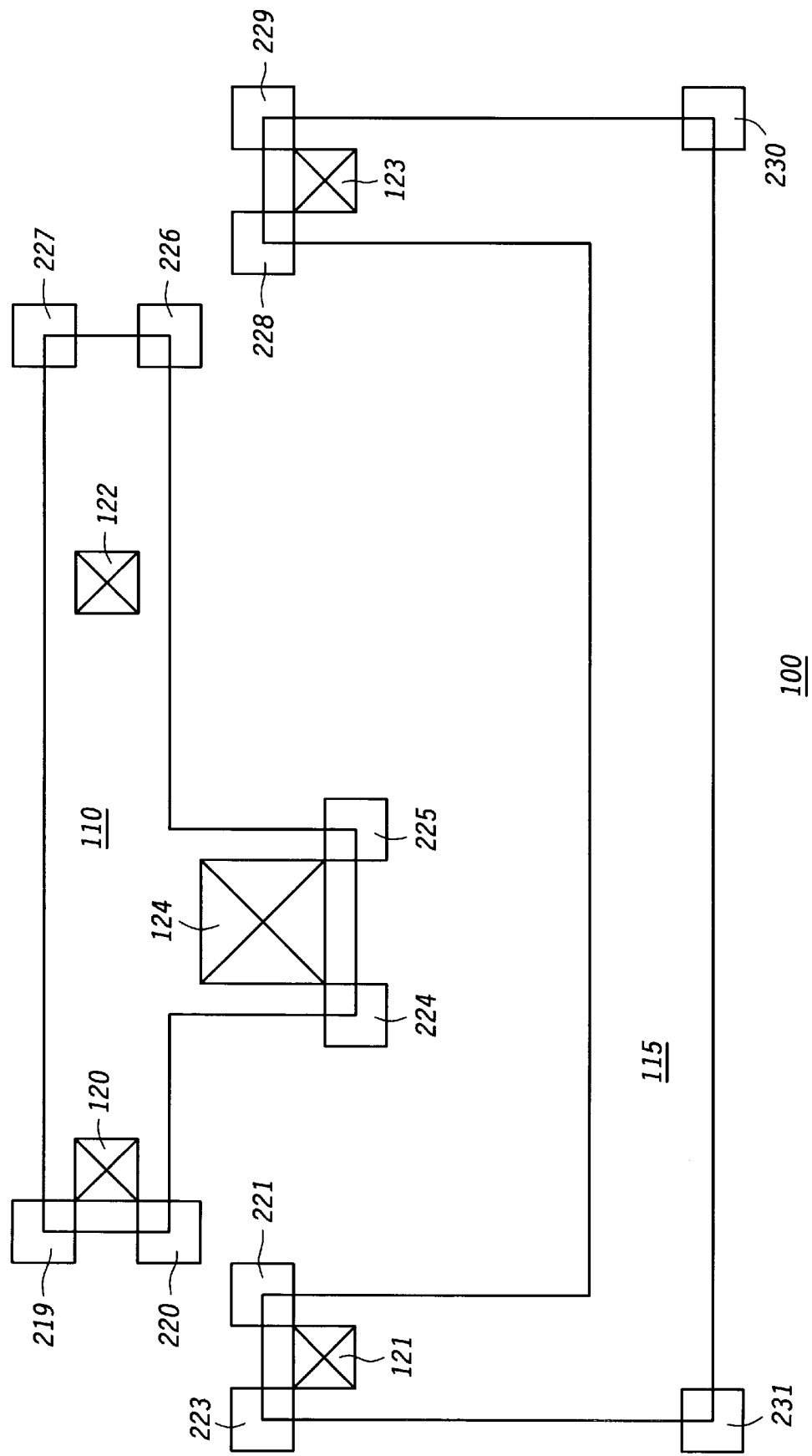
FIG. 2 illustrates, in plan view, the shapes of FIG. 1 following an LPC enhancement step in accordance with the prior art.

Next, at step 503, LPC shapes are added to those features remaining within the LPC database layer. Note, that the LPC database layer has identified the specific locations where LPC features are needed. Therefore, the step of adding the LPC shapes, will form a database file 101 is illustrated in FIG. 3. In the database file 101, the LPC features 219, 220, 221, 223, 226, 227, 228, and 229 have been added. Those LPC features which have not been included in database 101, but that were present in database 100 of FIG. 2, are those LPC features which were determined by the filtering step of 502 to not be needed. Specifically, in one embodiment, whereby the filtering is occurring based upon the feature shape width, the LPC features 224 and 225 of FIG. 2 have not been added to the LPC database layer 101 of FIG. 3. However, the other LPC features have been maintained since they were associated with a shape width in the predetermined criteria.

Figure 4:
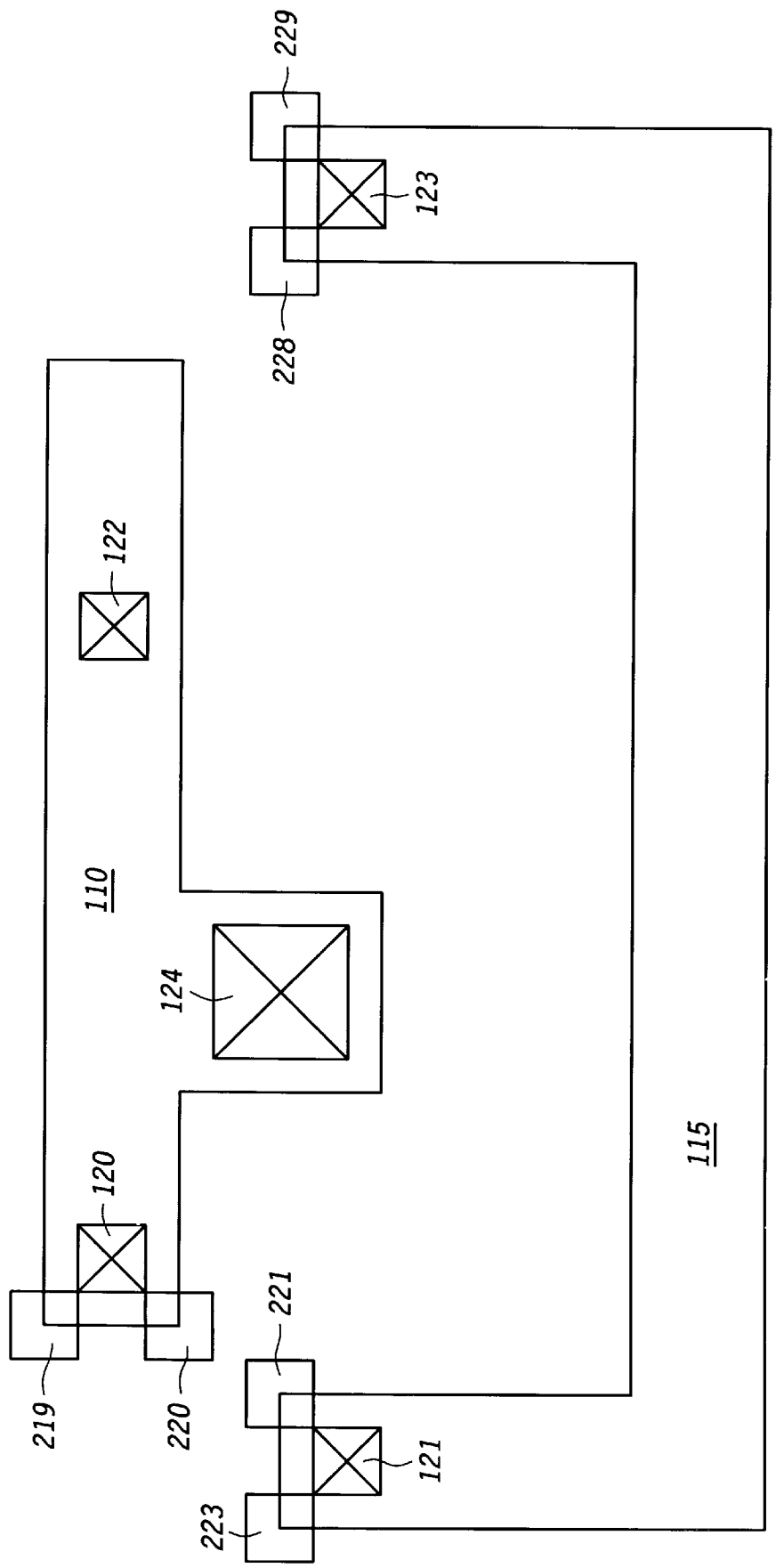

Next, at step 504, another filtering step occurs by first identifying a second database layer to use as a filtering function of the LPC shapes. Referring to FIG. 4, in this example, the contact database layer, which contains contacts 120 through 123, has been identified for use as the filtering function. By determining which contacts within the contact layer are in close proximity to the remaining LPC features, it can be determined whether or not there are any more LPC features which are unnecessary, and thereby can be filtered out. Referring to FIG. 4, it can be seen that the LPC features 219 and 220, 221 and 223, and 228 and 229 have been maintained in the database 102, which is the second filtered database. However, the LPC features 227 and 226 of FIG. 3 are not present within the second filtered database 102 of FIG. 4. This is because, in one embodiment, LPC features are not necessary on a narrow width interconnect structure where there is not also a contact within a given distance of its termination or end. Therefore, the contact 122 which is not close to the end of the feature 110, allows for the filtering of the LPC features 226 and 227.

It should be noted that these two filtering techniques are an improvement over the prior art. The first filtering which eliminates LPC features based upon specific layer information is an improvement over the prior art in that it reduces the number of features considered for LPC application. Given a variety of process conditions and geometric configurations there can exist situations where the benefits of LPC are diminished. In addition, the equipment which manufactures the lithographic reticules can more readily handle the information in that the overall quantity of information is reduced. Finally, the number of LPC features which are capable of interacting with one another, and thereby causing potential failures, is also greatly reduced by the two filtering methods described.

Figure 5:
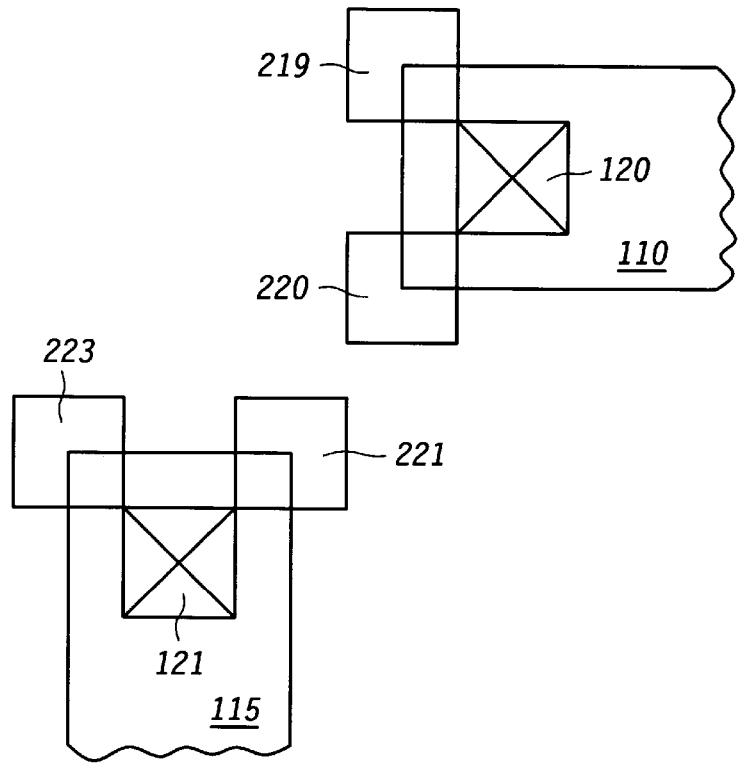
FIGS. 5 through 9 illustrate, in plan view, specific embodiments of the present invention.
Figure 6:
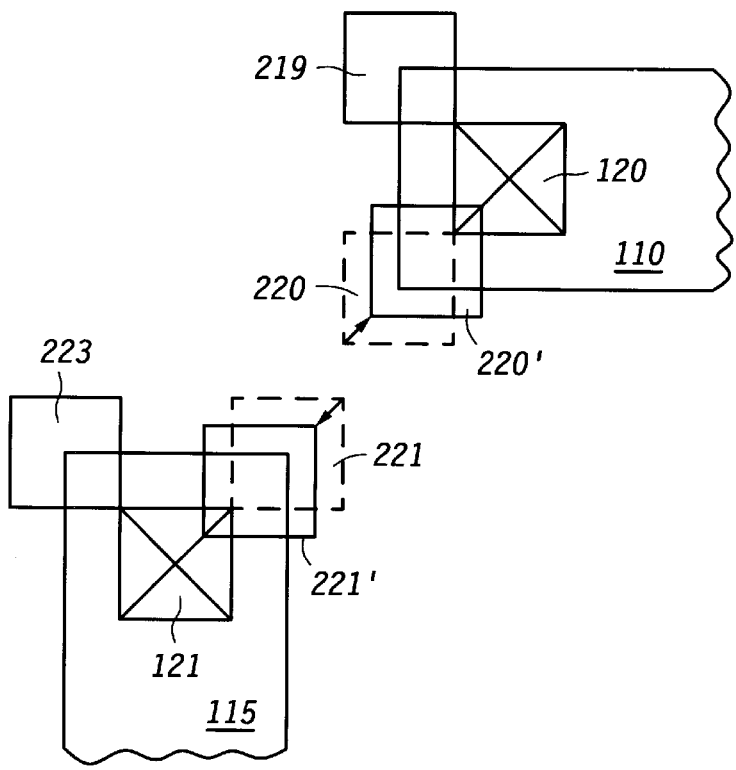

The step 505, which modifies the LPC shapes, would not only anticipate the removal of those LPC features which do not meet certain criteria in relationship with a second database layer, but would also anticipate the actual changing of the LPC shapes in order to more optimally allow for lithographic processing. Referring to FIG. 5, a blown-up portion of FIG. 4 is illustrated. The portion being the portion containing the LPC features 220 and 221, which, for purposes of discussion, are presumed to be too close to each other such that an interaction will occur during processing to effect a final manufactured semiconductor device. FIG. 6 illustrates one way in which the structure illustrated in FIG. 4 can be modified in order to overcome the problems of the prior art. By identifying those structures which potentially will interfere with each other, it would be possible to move the structures directly away from each other to allow for more spacing such has been done in FIG. 6. In FIG. 6, the LPC structure 221 has been moved to position 221', while the LPC structure 220 has been moved to position 220'. This leaves sufficient spacing between the two LPC features that the problems with the prior art will be avoided.

Figure 7:
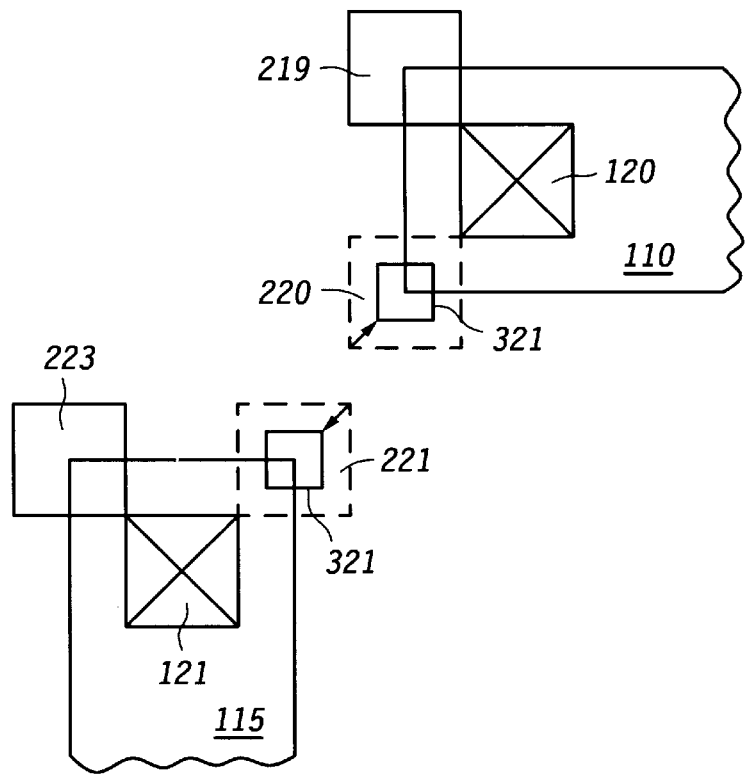

FIG. 7 illustrates another embodiment, whereby the LPC features are changed by shrinking their overall size in order to avoid interference among LPC features. FIG. 8 illustrates an embodiment whereby two LPC features are combined in order to form a "hammerhead" feature 325, whereby the hammerhead feature is further away from the LPC feature 220 such that interference is also avoided. FIG. 9 illustrates an embodiments whereby LPC features 220, 221 are truncated by lines 330, 335 in order to maintain the required distance between LPC features 220 and 221. One skilled in the art would understand that there are numerous changes among LPC features which could be incorporated to eliminate the interference.

In other embodiments of the present invention, it would be understood that the LPC features illustrated would not necessarily need to be rectangles or squares, but could be any of numerous other shapes including octagonal shapes, or triangular shapes that would meet the present intentions of the invention. In addition, it would be understood that in addition to outright modification of LPC features, it could be possible to perform a more fundamental design change in order to move a design interconnect, such as 115 to be further away from design interconnect 110. By doing so, the original LPC shapes 220 and 221 would not need to be modified. Many variations to the present invention could be entertained without changing the scope of the present invention.

Continuing with the flowchart of FIG. 10, at step 506, the modified LPC database of FIG. 4 is used to manufacture a lithographic reticule. In turn, at step 507, the lithographic reticule is used to pattern semiconductor wafers and thereby result in the manufacture of semiconductor devices.

The methods taught herein are used to modify gate level integrated circuit design files generated through CAD (computer aided design). These integrated circuit design files contain information regarding an integrated circuit and placement of gates, transistors, and the like in the integrated circuit. The resulting modified files are then used to form lithographic masks which are then used to form a plurality of integrated circuits on a plurality of wafers using an integrated circuit fabrication facility. The design phase is taught in "Principles of CMOS VLSI Design: A Systems Perspective", by N. H. E. Weste and K. Eshragian in the VLSI Series by Addison-Wesley, 1985. Fabrication techniques are outlined in "Silicon Processing for the VLSI Era, Volume 1: Process Technology", by Wolf and Tauber, copyright 1986, published by Lattice Press. Process integration is taught by the second book in the series: "Silicon Processing for the VLSI Era, Volume 2: Process Integration", by Wolf, copyright 1990, published by Lattice Press.

Figure 11:
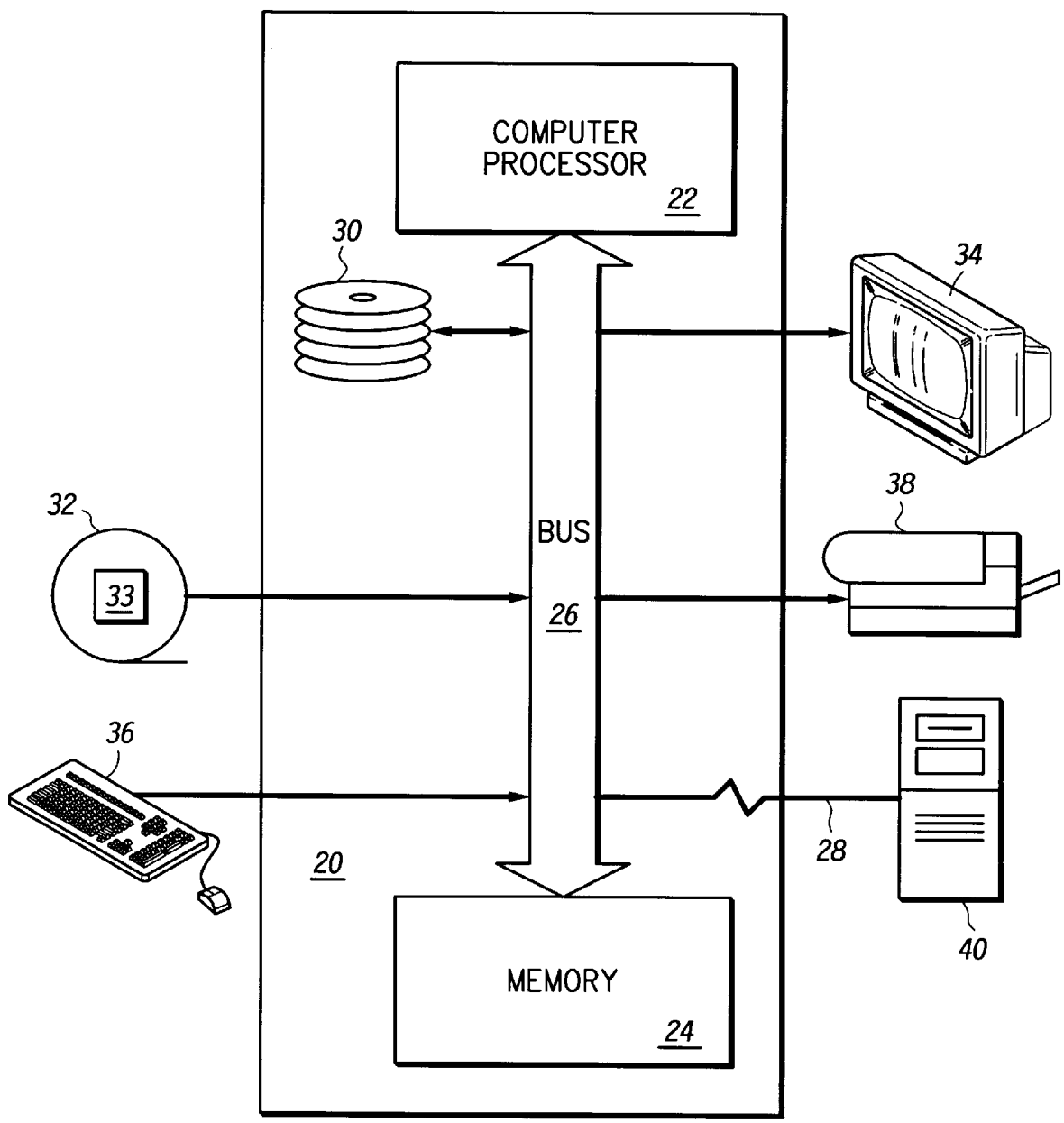
FIG. 11 is a block diagram illustrating a General Purpose Computer

FIG. 11 is a block diagram illustrating a General Purpose Computer 20. The General Purpose Computer 20 has a Computer Processor 22, and Memory 24, connected by a Bus 26. Memory 24 is a relatively high speed machine readable medium and includes Volatile Memories such as DRAM, and SRAM, and Non-Volatile Memories such as, ROM, FLASH, EPROM, EEPROM, and bubble memory. Also connected to the Bus are Secondary Storage 30, External Storage 32, output devices such as a monitor 34, input devices such as a keyboard (with mouse) 36, and printers 38. Secondary Storage 30 includes machine readable media such as hard disk drives, magnetic drum, and bubble memory. External Storage 32 includes machine readable media such as floppy disks, removable hard drives, magnetic tape, CD-ROM, and even other computers, possibly connected via a communications line. The distinction drawn here between Secondary Storage 30 and External Storage 32 is primarily for convenience in describing the invention. As such, it should be appreciated that there is substantial functional overlap between these elements. The original integrated circuit design files, as well as the modified integrated circuit design files created through the techniques disclosed herein are typically stored on either Secondary Storage 30 or External Storage 32. Computer software such as implement the techniques disclosed herein, and user programs can be stored in a Computer Software Storage Medium, such as memory 24, Secondary Storage 30, and External Storage 32. Executable versions of computer software 33, can be read from a Non-Volatile Storage Medium such as External Storage 32, Secondary Storage 30, and Non-Volatile Memory and loaded for execution directly into Volatile Memory, executed directly out of Non-Volatile Memory, or stored on the Secondary Storage 30 prior to loading into Volatile Memory for execution.

Those skilled in the art will recognize that modifications and variations can be made without departing from the spirit of the invention. Therefore, it is intended that this invention encompass all such variations and modifications as fall within the scope of the appended claims.

Claim elements and steps herein have been numbered and/or lettered solely as an aid in readability and understanding. As such, the numbering and/or lettering in itself is not intended to and should not be taken to indicate the ordering of elements and/or steps in the claims.

What is claimed is:

1. A method for modifying a set of lithographic proximity shapes in a design with a plurality of layers and containing the set of lithographic proximity shapes associated with a first set of shapes in the design, said method comprising:
selecting a second set of shapes in the design; and
modifying a subset of the lithographic proximity shapes in the first set of shapes based on the relationship of said lithographic proximity shapes to the second set of shapes to form a modified design.

2. The method in claim 1 wherein:
the first set of shapes are in a first layer of the design,
the second set of shapes are in a second layer of the design.

3. The method in claim 1 wherein:
the step of modifying comprises:
identifying a set of interconnect locations between the first set of shapes and the second set of shapes, and
removing a selected lithographic proximity shape from the subset of lithographic proximity shapes when the selected lithographic proximity shape is not within a predetermined distance from at least one in the set of interconnect locations.

4. The method in claim 1 wherein:
the step of modifying comprises:
identifying a set of interconnect locations between the first set of shapes and the second set of shapes, and
downsizing a selected lithographic proximity shape from the subset of lithographic proximity shapes when the selected lithographic proximity shape is not within a predetermined distance from at least one in the set of interconnect locations.

5. The method in claim 1 wherein:
the step of modifying comprises:
identifying a set of interconnect locations between the first set of shapes and the second set of shapes, and
upsizing a selected lithographic proximity shape from the subset of lithographic proximity shapes when the selected lithographic proximity shape is within a predetermined distance from at least one in the set of interconnect locations.

6. The method in claim 1 wherein:
the step of modifying comprises:
identifying a set of interconnect locations between the first set of shapes and the second set of shapes, and
moving a selected lithographic proximity shape from the subset of lithographic proximity shapes when the selected lithographic proximity shape is not within a predetermined distance from at least one in the set of interconnect locations.

7. The method in claim 1 wherein:
the step of modifying comprises:
identifying a set of interconnect locations between the first set of shapes and the second set of shapes, and
altering a first geometric shape of a selected lithographic proximity shape from the subset of lithographic proximity shapes into a second geometric shape when the selected lithographic proximity shape is not within a predetermined distance from at least one in the set of interconnect locations.

8. The method in claim 1 wherein:

the set of lithographic proximity shapes are stored separately from the first set of shapes in the design in a database stored in a Non-Volatile Storage Medium.

9. The method in claim 1 which further comprises:

manufacturing a lithographic reticle using the modified design, and patterning a semiconductor wafer utilizing the lithographic reticle.

10. The method in claim 1 which further comprises:

filtering a third set of shapes in the design for a set of predetermined criteria to form the first set of shapes in the design.

11. A method for modifying a design including a plurality of layers, the method comprising:

receiving an initial design representation including a plurality of layers;

filtering the initial design representation using a first set of predetermined criteria to form a filtered design representation;

applying a set of lithographic proximity shapes associated with a first set of shapes in the filtered design representation;

selecting a second set of shapes in the filtered design representation;

modifying a subset of the lithographic proximity shapes in the first set of shapes based on the relationship of the lithographic proximity shapes to the second set of shapes to form a modified filtered design representation;

and forming a modified design using said modified filtered design representation.

12. The method, as recited in claim 11, wherein:

the first set of shapes is in a first layer of the filtered design representation; and the second set of shapes is in a second layer of the filtered design representation.

13. The method, as recited in claim 11, wherein the step of modifying comprises:

identifying a set of interconnect locations between the first set of shapes and the second set of shapes; and removing a selected lithographic proximity shape from the subset of lithographic proximity shapes when the selected lithographic proximity shape is not within a predetermined distance from at least one in the set of interconnect locations.

14. The method, as recited in claim 11, wherein the step of modifying comprises:

identifying a set of interconnect locations between the first set of shapes and the second set of shapes; and downsizing a selected lithographic proximity shape from the subset of lithographic proximity shapes when the selected lithographic proximity shape is not within a predetermined distance from at least one in the set of interconnect locations.

15. The method, as recited in claim 11, wherein the step of modifying comprises:

identifying a set of interconnect locations between the first set of shapes and the second set of shapes; and upsizing a selected lithographic proximity shape from the subset of lithographic proximity shapes when the selected lithographic proximity shape is within a predetermined distance from at least one in the set of interconnect locations.

16. The method, as recited in claim 11, wherein the step of modifying comprises:

identifying a set of interconnect locations between the first set of shapes and the second set of shapes; and moving a selected lithographic proximity shape from the subset of lithographic proximity shapes when the selected lithographic proximity shape is not within a predetermined distance from at least one in the set of interconnect locations.

17. The method, as recited in claim 11, wherein the step of modifying comprises:

identifying a set of interconnect locations between the first set of shapes and the second set of shapes; and altering a first geometric shape of a selected lithographic proximity shape from the subset of lithographic proximity shapes into a second geometric shape when the selected lithographic proximity shape is not within a predetermined distance from at least one in the set of interconnect locations.

18. The method, as recited in claim 11, wherein:

the filtered design representation is a database stored in a non-volatile storage medium.

19. The method, as recited in claim 18, wherein:

the set of lithographic proximity shapes is stored separately from the first set shapes in said database.

20. The method, as recited in claim 11, further comprising:

manufacturing a lithographic reticle using the modified design; and patterning a semiconductor wafer utilizing the lithographic reticle.

21. The method, as recited in claim 11, further comprising:

filtering a third set of shapes in the filtered design representation using a second set of predetermined criteria to form the first set of shapes.

* * * * *

UNITED STATES PATENT AND TRADEMARK OFFICE
CERTIFICATE OF CORRECTION

PATENT NO. : 5,958,635

DATED : September 28, 1999

INVENTOR(S) : Alfred John Reich et al.

It is certified that error appears in the above-identified patent and that said Letters Patent is hereby corrected as shown below:

On the title page item [75], the fourth Inventor reads "James N. Conner"; change to read --James L. Conner--.

Signed and Sealed this

Twenty-fifth Day of April, 2000

Attest:

Q. TODD DICKINSON

*Attesting Officer*   *Director of Patents and Trademarks*